(12) United States Patent
Ho

(10) Patent No.: US 10,658,262 B2
(45) Date of Patent: May 19, 2020

(54) PIN FLEXURE ARRAY

(71) Applicant: Ball Aerospace & Technologies Corp., Boulder, CO (US)

(72) Inventor: Joseph Hsing-Hwa Ho, Boulder, CO (US)

(73) Assignee: Ball Aerospace & Technologies Corp., Boulder, CO (US)

( * ) Notice: Subject to any disclaimer, the term of this patent is extended or adjusted under 35 U.S.C. 154(b) by 0 days.

(21) Appl. No.: 16/206,269

(22) Filed: Nov. 30, 2018

(65) Prior Publication Data

US 2019/0267730 A1   Aug. 29, 2019

Related U.S. Application Data

(60) Provisional application No. 62/635,886, filed on Feb. 27, 2018.

(51) Int. Cl.
| | |
|---|---|
| *H01L 23/367* | (2006.01) |
| *H05K 7/20* | (2006.01) |
| *F16B 1/00* | (2006.01) |
| *F16B 5/00* | (2006.01) |
| *H01R 12/57* | (2011.01) |
| *H05K 1/18* | (2006.01) |
| *H05K 3/32* | (2006.01) |

(52) U.S. Cl.
CPC ......... *H01L 23/3677* (2013.01); *H01R 12/57* (2013.01); *H05K 1/18* (2013.01); *H05K 3/321* (2013.01); *F16B 2001/0078* (2013.01); *H05K 7/20409* (2013.01); *H05K 2201/068* (2013.01); *H05K 2201/10151* (2013.01); *H05K 2201/10318* (2013.01)

(58) Field of Classification Search
CPC ... H05K 7/20409; H05K 7/2039; F28F 13/00; H01L 23/367; H01L 23/3677
USPC ......... 361/704, 710, 719; 165/80.3; 257/722
See application file for complete search history.

(56) References Cited

U.S. PATENT DOCUMENTS

| | | | | |
|---|---|---|---|---|
| 4,546,405 | A | * | 10/1985 | Hultmark ............ H01L 23/3677 165/80.3 |
| 4,868,638 | A | * | 9/1989 | Hirata .................... H01L 23/055 257/697 |
| 5,886,870 | A | * | 3/1999 | Omori ..................... H01L 23/32 165/185 |
| D437,844 | S | * | 2/2001 | Sayers ......................... D14/137 |

(Continued)

FOREIGN PATENT DOCUMENTS

EP        1686628        8/2006

OTHER PUBLICATIONS

International Search Report and Written Opinion for International (PCT) Patent Application No. PCT/US2018/063398, dated Mar. 19, 2019 13 pages.

*Primary Examiner* — Zachary Pape
(74) *Attorney, Agent, or Firm* — Sheridan Ross P.C.

(57) ABSTRACT

Interconnection systems and methods are provided. An interconnector as disclosed allows for a first component having a first coefficient of thermal expansion to be joined to a second component having a second coefficient of thermal expansion securely, and while maintaining a precise alignment between the components. The interconnector generally includes a plurality of pins that each have a free end that is adhered to the first component for imaging, sensing, tracking, processing, and other applications.

14 Claims, 8 Drawing Sheets

(56) References Cited

U.S. PATENT DOCUMENTS

| | | | | |
|---|---|---|---|---|
| 6,942,025 B2* | 9/2005 | Nair | ............................ | F28F 3/04 |
| | | | | 165/185 |
| 7,449,777 B2* | 11/2008 | Deboy | ..................... | H01L 25/16 |
| | | | | 257/723 |
| 8,928,155 B2* | 1/2015 | Kalliopuska | ....... | H01L 27/14661 |
| | | | | 257/777 |
| 8,964,042 B2* | 2/2015 | Nozawa | ................ | H04N 5/2252 |
| | | | | 348/208.3 |
| 9,555,505 B2* | 1/2017 | Kokubo | ................. | B21C 23/186 |
| 10,177,065 B2* | 1/2019 | Kim | ........................ | H01L 23/367 |
| 2005/0122689 A1* | 6/2005 | Pozzuoli | .................. | G06F 1/182 |
| | | | | 361/704 |
| 2005/0280993 A1 | 12/2005 | Campbell et al. | | |
| 2008/0128896 A1* | 6/2008 | Toh | ......................... | H01L 23/473 |
| | | | | 257/712 |
| 2013/0344660 A1 | 12/2013 | Colgan et al. | | |
| 2014/0246783 A1* | 9/2014 | Nishizawa | ............. | H01L 25/072 |
| | | | | 257/774 |
| 2015/0211377 A1 | 7/2015 | Lacy et al. | | |
| 2016/0035646 A1 | 2/2016 | Soyano | | |
| 2016/0069622 A1* | 3/2016 | Alexiou | ................. | G06F 1/1656 |
| | | | | 165/146 |

\* cited by examiner

PIN FLEXURE ARRAY

CROSS REFERENCE TO RELATED APPLICATIONS

This U.S. Non-Provisional application claims priority to and the benefit of U.S. Provisional Patent Application Ser. No. 62/635,886, filed Feb. 27, 2018, the entire disclosure of which is hereby incorporated by reference.

FIELD

The present disclosure provides a flexure or mount for joining objects having significantly different coefficients of thermal expansion for imaging, sensing, tracking, processing and other applications.

BACKGROUND

The joining of objects having different coefficients of thermal expansion is a problem, particularly where a secure and stable interconnection is required. For example, detectors that are used in a variety of sensors for remote sensing and imaging applications such as star trackers using a Complementary Metal Oxide Semiconductor ("CMOS") stellar sensor or a Charged Coupled Device ("CCD") stellar sensor to provide highly accurate attitude information or to support inertial or other navigation for a host vehicle (e.g., a spacecraft) or system often need to be precisely and securely mounted. However, the semiconductor, ceramic, or other materials associated with such detectors often have a much lower coefficient of thermal expansion than the materials making up the structure around them. The interface between the materials of different coefficients of thermal expansion is often a source of mechanical hysteresis and poses difficulties to the design and manufacturing of high-performance assemblies.

Solutions for joining objects having significantly different coefficients of thermal expansion have included the use of specialized welding techniques, adhesives, compliant interconnections, and interposer devices. However, such solutions have typically been difficult to implement, prone to allowing strain to develop in connected components, incapable of providing adequate positional stability, incapable of providing a secure connection over a wide range of temperatures, do not provide adequate levels of thermal conduction, and/or are prone to failure.

As a particular example, solutions involving welding or adhering one component to another often result in the introduction of mechanical strain in one or both of the components as a result of the differential thermal expansion of the components, which can result in alignment errors, fatigue, and failure. The introduction of an interposer can reduce such thermally induced strain. However, the use of an interposer can increase the problem of mechanical settling. The secure joining of components having differing coefficients of thermal expansion with high precision can also require high machining and alignment tolerances in order to achieve a close fit. For example, interconnections can incorporate a shrink fit plug in one component and a hole in the other component to receive the plug. However, sufficiently high tolerances are difficult to achieve, and the adequacy of completed connections can be difficult to test. Moreover, the components can separate from one another if the mechanical tolerances are improper. In addition, after the components are joined, thermal cycling may need to be performed in order to ensure that the components have fully settled and that the connection has stabilized.

Existing designs and solutions employing flexure mounting are known to provide very poor thermal conductivity through a flexure. Thermal straps can be used in combination with the mounts in order to mitigate this loss in conductivity at the expense of complexity and cost. Although such designs can be engineered to work over wide temperature ranges, they generally create more mechanical joints which increased the potential for hysteresis.

SUMMARY

Accordingly, there has been long-felt and unmet need to provide methods, devices and systems for joining components having different thermal coefficients of expansion in a secure manner.

Embodiments of the present disclosure provide an interconnector suitable for joining components having different thermal coefficients of expansion to one another securely and precisely. In accordance with at least some embodiments, an interconnector including a base and a pin array is provided. The pin array includes a plurality of pins that extend from a first side of the base. The base of the interconnector can include a bonding surface, mount, or other provision for fixing the base to a larger assembly or platform, including but not limited to an instrument structure. An assembly incorporating an interconnector in accordance with embodiments of the present disclosure can include a component including but not limited to a detector package that is connected to the free ends of the pins included in the pin array by an adhesive. For example, for a star tracker sensor, the stellar detector package is contemplated as comprising a CMOS stellar sensor or CCD stellar sensor. In further embodiments, detector packages comprise detectors for other applications covering other parts of the electromagnetic spectrum. Most previous methods have used assembly methods that provide good initial alignment, however the stability and longevity of that initial alignment is jeopardized through environmental conditions and other factors, and is compounded by higher part counts and increased interface joints. Embodiments of the present disclosure minimize the number of parts and joints and thereby reduce complications associated with alignment, connection and durability of an assembled structure.

In various embodiments, a pin array comprises a plurality of pins that extend from a base. The pins included in the pin array are contemplated as being configured to accommodate thermal expansion of a component bonded to the free ends of the pins. Accordingly, the pins generally feature a length, measured between a base and a free end of the pin, that is much greater than (e.g. at least 10 times more than) a dimension of the pin in a cross-section taken transverse to the length of the pin. Stability of the component relative to the base can be established by providing a relatively large number, such as 8 or more, pins within the pin array. In accordance with still other embodiments, the number of pins within the pin array can be 64 or greater. In accordance with still other embodiments of the present disclosure, the number of pins in the pin array can be 400 or greater. In accordance with the least some embodiments of the present disclosure, the pins within the array can be arranged in rows and columns. Moreover, an area of the pin array can be the same or about the same as an area of an interconnected component.

In accordance with the least some embodiments of the present disclosure, a free end of each of the pins is provided at a first distance from a plane defined by a surface of the base. In accordance with other embodiments of the present disclosure, a free end of most of the pins is a first distance from a plane defined by a surface of the base, while at least three of the pins are a second distance from the plane defined by the surface of the base, where the first distance is less than the second distance. In accordance with still further embodiments of the present disclosure, the pins may extend from a base pedestal formed on the base. In accordance with at least some embodiments of the present disclosure, a surface of the base pedestal from which the pins extend is planar. In accordance with other embodiments of the present disclosure, the surface of the pedestal from which the pins extend is nonplanar. Where the surface of the pedestal is nonplanar, there may be a range of lengths of pins in the pin array, where the links of each pin is measured from an intersection of the pin with a surface of the base pedestal and the free end of the pin. The length of the pins may vary based on various criteria, such as a distance of the pin from a center of the pin array, the location of the pin within the array relative to one or more axes configured relative to the array, or the like.

The pins may be provided with bevels or other surface features. For example, an end of each pin may be beveled on some or all of the sides of the free end of the pin. In accordance with still other embodiments of the present disclosure, a notch or capillary stop may be formed on some or all sides of the pin, adjacent the free end of the pin. In accordance with still further embodiments, a stress relieving notch may be formed at the intersection between the pin and the surface of the base pedestal.

In one embodiment, an interconnector operable to join components having different coefficients of thermal expansion is provided. The interconnector comprises a base and a pin array including a plurality of pins that extend from the base and that are disposed in a plurality of rows and columns. At least some of the plurality of pins comprise a free end provided a first distance from the base. Each of the plurality of pins are spaced apart from an adjacent pin and the pin array is operable to provide a physical connection to an additional component. It is contemplated that the additional component may comprise a different coefficient of thermal expansion than the interconnector. The structure of the interconnector accommodate this difference by providing mechanical flexure and is also contemplated as providing a heat sink for the additional component. In some embodiments, the free ends of the pins in the pin array are operable to receive an adhesive that secures the pin array to an additional component.

In another embodiment, an interconnector operable to join components is provided. The interconnector comprises a base and a pin array including a plurality of pins that extend from the base. At least some of the plurality of pins comprise a free end on an opposing end of the pin relative to the base. Each of the plurality of pins are spaced apart from an adjacent pin and the pin array is operable to provide at least a portion of a physical connection to an additional component. It is contemplated that the additional component may comprise a different coefficient of thermal expansion than the interconnector. The structure of the interconnector accommodate this difference by providing mechanical flexure and is also contemplated as providing a heat sink for the additional component. An adhesive or joining material is provided, wherein the adhesive is in contact with a free end of at least most of the pins, and wherein the adhesive is operable to bond the interconnector to an additional device.

In another embodiment, an interconnector assembly is provided that comprises an interconnector comprising a base and a pin array. The pin array comprises a plurality of pins extending from the base. A first assembly is connected to the interconnector and is in contact with at least some of the plurality of pins. An adhesive is provided and is in contact with the first assembly and a free end of at least some of the plurality of pins.

In various embodiments, methods of forming and manufacturing an interconnector are provided. In one embodiment, a method is provided comprising the steps of: forming an interconnector comprising a base, providing a pin array on the base, and wherein the step of providing the pin array comprises forming a plurality of pins by making a plurality of cuts in a first direction and a plurality of cuts in a second direction. At least some of the plurality of pins comprise a free end on an opposing end of the pin relative to the base. Each of the plurality of pins are spaced apart from an adjacent pin. A detector assembly is provided that comprises a lens, a processor, and at least one of a Complementary Metal Oxide Semiconductor device and a Charged Coupled device. An adhesive or joining material is provided, wherein the adhesive is in contact with a free end of at least some of the pins, and at least a portion of the detector assembly is secured to the pin array via the adhesive.

Additional features and advantages of embodiments of the present disclosure will become more readily apparent from the following description, particularly when considered together with the accompanying drawings.

DETAILED DESCRIPTION

Figure 1:
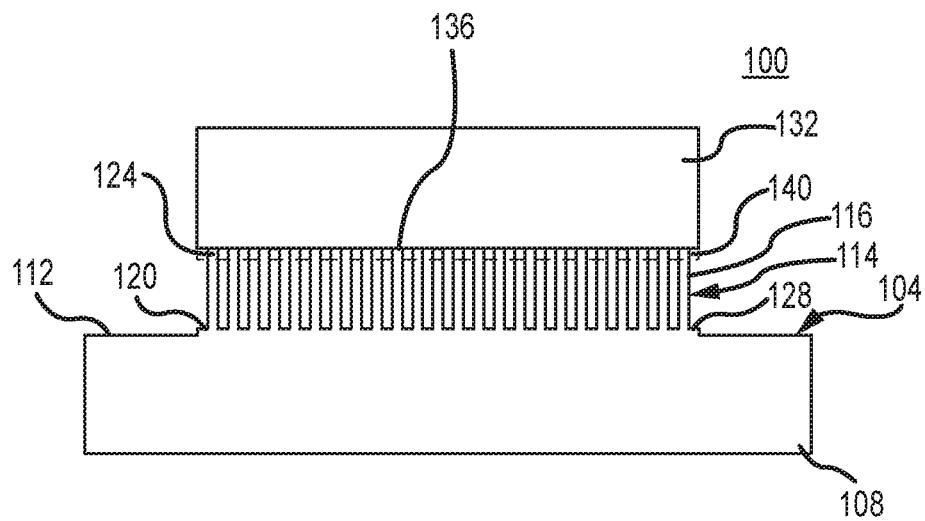
FIG. 1 is an elevation view of an assembly including an interconnector in accordance with embodiments of the present disclosure.
Figure 2:
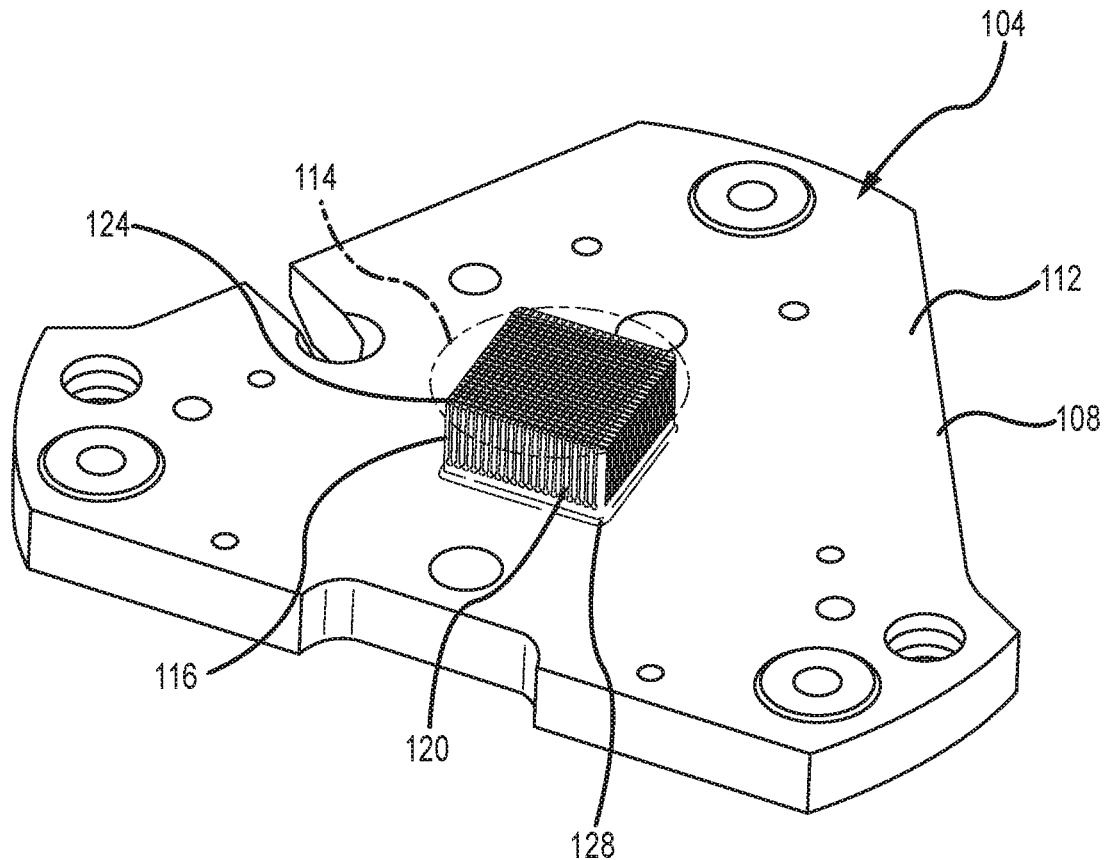
FIG. 2 is a perspective view of an interconnector in accordance with embodiments of the present disclosure.

With reference now to FIG. 1, an assembly 100 incorporating an interconnector 104 in accordance with embodiments of the present disclosure is illustrated. In particular, FIG. 1 depicts an assembly 100 in a side elevation view. FIG. 2 depicts an interconnector 104 in a top perspective view. In general, the interconnector 104 includes a base 108 with a surface 112 that defines or is intersected by a base reference plane. The interconnector 104 additionally includes an array 114 that includes a plurality of pins 116. Each pin 116 extends from the base 108 to a free end 124. In accordance with at least some embodiments of the present disclosure, the base portion 120 of each of the pins 116 may extend from a base pedestal portion 128. In general, the base pedestal portion 128 is raised from the surface 112 of the base 108. The base pedestal portion 128 of various embodiments, including that shown in FIG. 2, comprises a substantially rectangular base. FIG. 2 depicts a rectilinear base pedestal in the form of a square. In alternative embodiments, the base pedestal portion 128 comprises various other geometric shapes including, but not limited to, circular, hexagonal, trapezoidal, and irregular shapes. Accordingly, no limitation is provided with respect to the shape of the base pedestal portion 128. Similarly, while various embodiments of the present disclosure contemplate pins with a rectangular cross-section, alternative embodiments are contemplated. The pins of embodiments of the present disclosure are contemplated as comprising various cross-sectional shapes including, but not limited to circular and irregular cross-sectional shapes. Additionally, the shape and thickness of pins are contemplated as varying along their length.

Also depicted in FIG. 1 is a first component 132. In general, the first component 132 has a coefficient of thermal expansion that is different than a coefficient of thermal expansion of the base 108. In accordance with embodiments of the present disclosure, the first component 132 is an electronic component. For example, the first component 132 may comprise a detector assembly that incorporates a focal plane array.

Accordingly, as can be appreciated by one of skill in the art after consideration of the present disclosure, the first component 132 may be a component that requires precise alignment stability relative to the base 108 over a wide range of temperatures. The first component 132 may comprise a plurality of sub-components or assemblies, such as a package structure, and a detector element such as a CMOS or CCD detector for a star tracker application or other detectors used in other applications covering the electromagnetic spectrum. In accordance with embodiments of the present disclosure, a bonding surface 136 of the first component 132 is fixed to the free ends 124 of the pins 116 by an adhesive 140. Brazing, soldering, and welding are also contemplated as alternates to using adhesive for bonding the pins to the first component 132.

The free ends 124 of the pins 116 are separate from one another, and the array 114 of pins 116 accommodates differences in the coefficients of thermal expansion of the first component 132 and the base 108. In particular, small changes in the dimensions of the first component 132 along the bonding surface 136 adhered to the free ends 124 of the pins 116 can be accommodated by movement of the free end 124 of any one pin 116 relative to the free end 124 of an adjacent pin 116. In addition, the relatively small area of adhesive 140 between the free end 124 of each pin 116 and the bonding surface 136 of the first component 132, can improve the reliability of the joint, at least within a specified range of operating temperatures. Moreover, while the pin 116 configuration provides compliance with respect to changes in the dimensions of the bonding surface 136 of the first component 132 in areas between adjacent pins 116, the pin array 114 provides stability and prevents movement of the first component 132 relative to the base 108 due to various influences, including thermal and mechanical influences.

Figure 3:
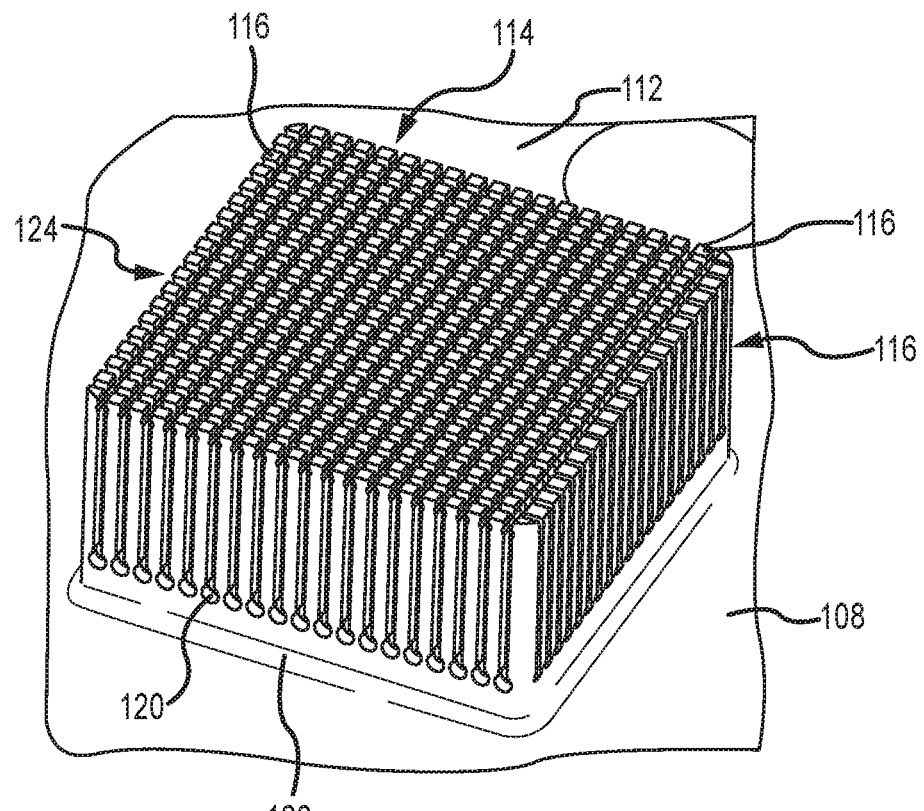
FIG. 3 is a perspective view of an interconnector in accordance with embodiments of the present disclosure.

FIG. 3 illustrates a pin array 114 in accordance with an exemplary embodiment of the present disclosure. In this example, the pin array 114 includes 400 pins, arranged in a matrix of 20 rows and 20 columns. The base pedestal 128 has a planar surface underlying the pin array 114. In addition, the free end 124 of each pin 116 is a first distance from the surface of the base pedestal 128. Accordingly, each pin 116 has a length, measured from the base 120 of a subject pin 116, and adjacent to the base pedestal 128 and the free end 124 of the pin 116 that is the same.

Figure 4:
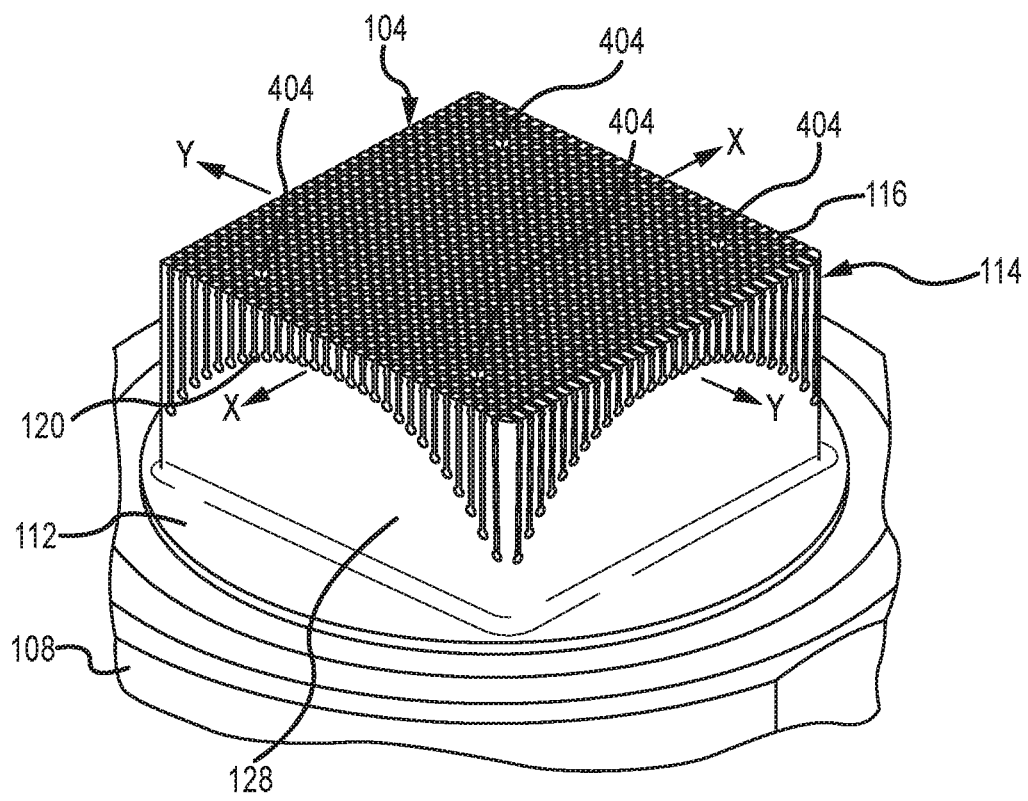
FIG. 4 is a perspective view of an interconnector in accordance with other embodiments of the present disclosure.

FIG. 4 illustrates a pin array 114 in accordance with another exemplary embodiment of the present disclosure. In this example, the pin array 116 includes 900 pins, arranged in a matrix of 30 rows and 30 columns. The majority of the pins 116 have a free end 124 that is a first distance from the surface 112 of the base 108, while at least some of the pins 116, in this example 4 of the pins, indicated by reference numeral 404 in the figure, have a free end 124 that is a second distance from the surface 112 of the base 108.

In addition, FIG. 4 illustrates an interconnector 104 with a base 108 that includes a base pedestal 128 having a curved surface underlying the pin array 114. As a result, the length of at least the pins 116 having a free end 124 that is a first distance from the surface 112 of the base 108 can vary, depending on the location of the pin 116 within the array 114. For instance, the surface of the base pedestal 128 is configured such that the pins 116 lying along two perpendicular axes, labeled X and Y in the figure, positioned at or near the center of the pedestal 128, are the shortest, while the pins 116 at or near the corners of the array 114 are the longest. This configuration can provide pins 116 that are more compliant with respect to thermal expansion or contraction of a connected component towards the edges of the array 114, while providing at least some relatively short, stiffer pins 116 to ensure maintenance of precise alignment tolerances of the connected component relative to the base 108. In addition, the particular configuration illustrated in FIG. 4 facilitates fabrication of the pin array 116 using wire electrical discharge machining ("EDM") processes. In accordance with still other embodiments, other base pedestal 128 surface configurations are possible. For example, the surface of the base pedestal 128 may be generally hemispherical under the pin array 114, to provide pins 116 that increase in length with distance from the center of the pin array 114. Such a configuration can provide increased compliance at the edges of the pin array 114, where changes in the dimensions of the bonding surface of a first component due to thermal influences are greatest, while maintaining precise alignment of the first component 132 relative to the base 108 by, at least in part, providing shorter, stiffer pins 116 towards the center of the pin array 114.

As shown in various Figures, including FIG. 4, the pin array 114 includes a plurality of pins 116 in rows and columns and with orthogonal gaps or voids extending therebetween. In alternative embodiments, the pin array 114 is rotated approximately 45 degrees from the orientation shown in FIG. 4 and relative to the base 108. In such embodiments, cuts or voids between the pins 116 extend diagonally across the base 108 of the device.

Figure 5:
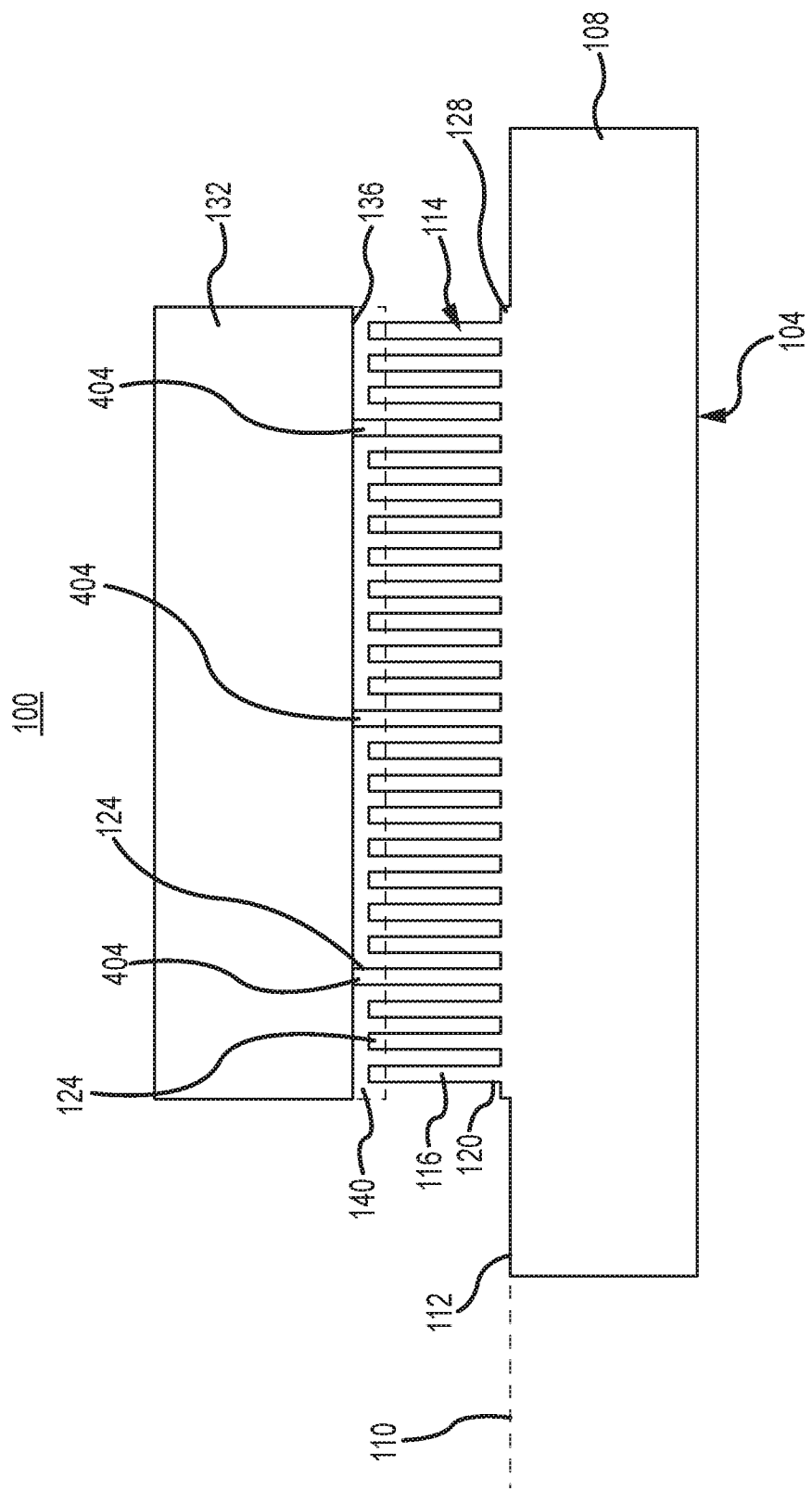
FIG. 5 is an elevation view of an assembly including an interconnector in accordance with other embodiments of the present disclosure.

FIG. 5 depicts an assembly 100 incorporating an interconnector 104 in accordance with further embodiments of the present disclosure in a side elevation view. More particularly, and as shown in the embodiment of FIG. 5, a pin array 114 includes a majority of pins 116 with a free end 124 that is a first distance from a plane 110 extending through or parallel to a first surface 112 of the base 108, and at least some pins 404 with a free end 124 that is farther from that plane 110 relative to the first set of pins 116. Moreover, as depicted in FIG. 5, the free ends 124 of the pins 404 that extend farther from the reference plane are in contact with the bonding surface 136 of the first component 132. The free ends of the majority of the pins 116 (i.e. the pins with a free end that is a first distance from the reference plane) are spaced apart from and connected to the bonding surface 136 of the first component 132 by a thin layer of the adhesive 140. As can be appreciated by one of skill in the art after consideration of the present disclosure, when the first component 132 is placed in contact with the pins 404 that extend farther from the base 108 reference plane, a spacing or gap of a predetermined size is maintained between the bonding surface 136 and the free ends of the majority of the pins 116. As can also be appreciated, such a gap can facilitate the secure bonding of the first component 132 by the adhesive 140. In this example, three pins 404 extend farther from the reference plane than the majority of the pins number 116. However, it should be appreciated that the number of longer pins 404 can be any number equal to three or greater, in order to achieve the described positioning and spacing advantages.

Figure 6:
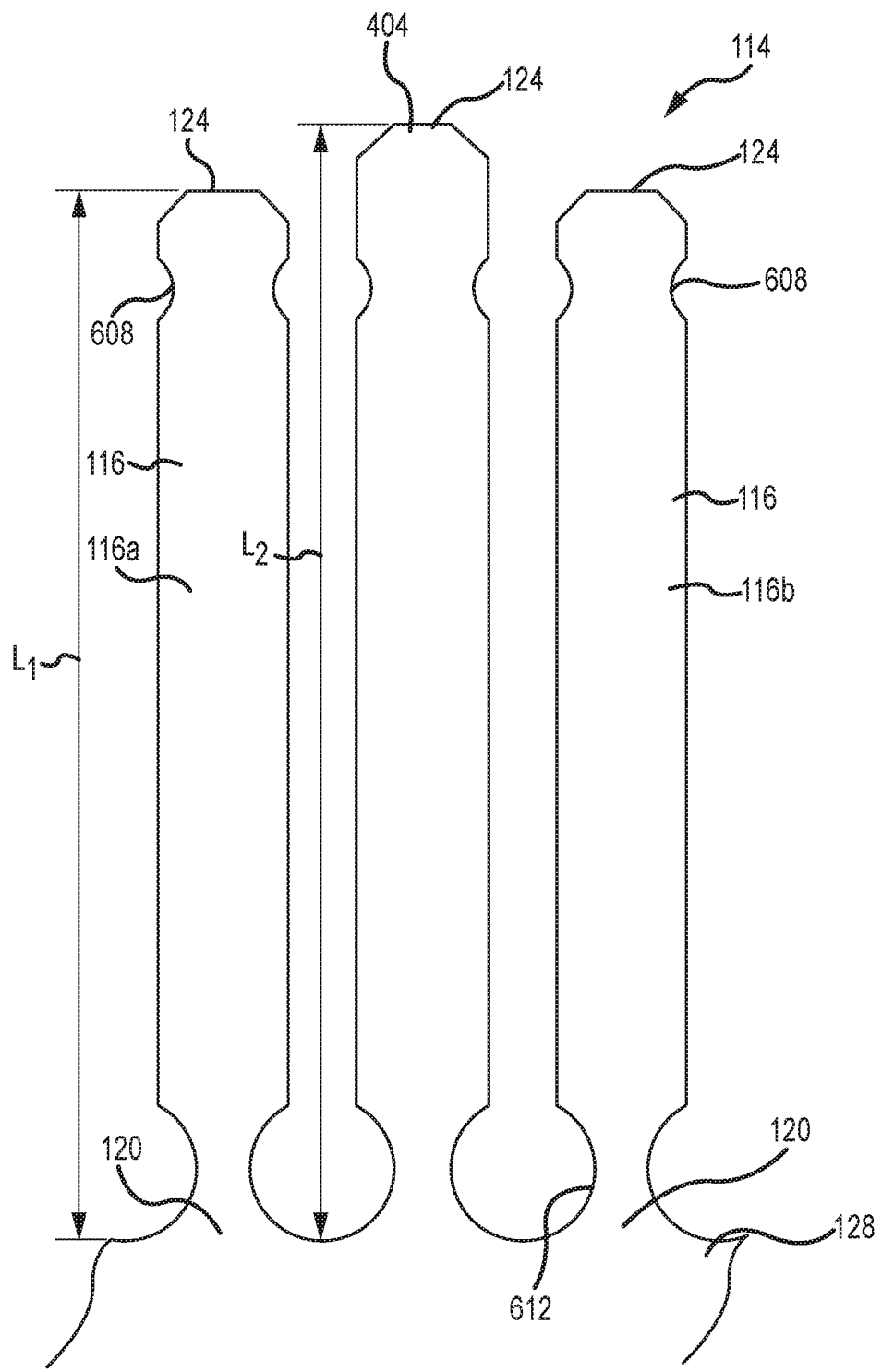
FIG. 6 is an elevation view of details of pins included in a pin array of an interconnector in accordance with embodiments of the present disclosure.

With reference now to FIG. 6, a detail of a pin array 114, and in particular an illustration of a number of pins 116 included in an interconnector 104 in accordance with embodiments of the present disclosure are depicted in a side elevation view. The pins 116 include two pins, labeled 116a and 116b having a first length ($L_1$), where the length is measured from an intersection of the base 120 of the pin 116 and the base pedestal 128, and the free end 124 of the pin 116. A third pin 404 is provided that comprises a second length ($L_2$). In this exemplary embodiment, each of the pins 116, 404 feature a capillary stop 608 towards the free end 124. In general, the capillary stop 608 is in the form of a notch, groove, or other depression formed in some or all of the edges of the respective pin 116, 404. The capillary stops 608 assist in maintaining an adhesive layer 140 towards the free end 124 of the pins 116, 404. In addition, the figure illustrates the inclusion of a stress relief or compliance feature 612 at the base 120 of the pins 116, 404. The compliance feature 612 comprises a necked portion of reduced pin thickness proximal to the base of the pins. The compliance features 612 enable enhanced flexure of the pins, and provide for a stress concentration feature proximal to the base 128.

In various embodiments, and as shown in FIGS. 1-6 (for example), an interconnector 104 is provided that comprises a base 108 and a pin array 114 including a plurality of pins 116 that extend from the base 108. At least some of the plurality of pins 116 comprising a free end 124 provided a first distance from the base 108, and wherein each of the plurality of pins 116 are spaced apart.

In one embodiment, at least three 404 of the plurality of pins of the interconnector 104 each have a free end 124 that is a second distance from the base 108, and wherein the second distance is greater than the first distance. It is contemplated that the length of each of the at least three pins 404 is the same, and a length of each of the remainder of the pins 116, measured from a base of each of the remainder of the pins to the free end of the remainder of the pins, is the same.

In some embodiments, a length of at least a first pin 116 located proximal to a center of the pin array 114 is less than a length of at least a second pin 404 that, relative to the first pin 116, is located proximal to an edge of the pin array 114.

In preferred embodiments, interconnectors of the present disclosure comprise a base pedestal 128, wherein the base pedestal 128 is formed on the base 108, and wherein the pins 116, 404 extend from the base pedestal 128, and wherein a surface of the base pedestal 128 is nonplanar. In certain embodiments, a surface of the base pedestal is curved or convex.

In various embodiments, interconnectors comprise a base 108 and pins 116, 404 that are formed from a single piece of thermally conductive material (e.g. aluminum).

In one embodiment, an interconnector assembly is provided that comprises an interconnector 104 with a base 108 and a pin array 114. The pin array 114 comprises a plurality of pins 116, 404 extending from the base 108. A first assembly 700 is connected to the interconnector 104 and is in contact with at least some of the plurality of pins 116, 404. An adhesive 140 is provided in contact with the first assembly 700 and a free end 124 of at least some of the plurality of pins 116, 404.

In some embodiments, the interconnector assembly comprises a detector assembly. More specifically, in certain embodiments, the interconnector assembly comprises a Complementary Metal Oxide Semiconductor device. In further embodiments, the first assembly comprises a Charged Coupled device.

In some embodiments, the interconnector assembly comprises a base 108 and a pin array 114 that are formed from a single piece of thermally conductive material, such as aluminum.

In various embodiments, interconnectors and connected devices are provided that comprise a thermoelectric cooler for managing heat in the assembly.

Figure 7A:
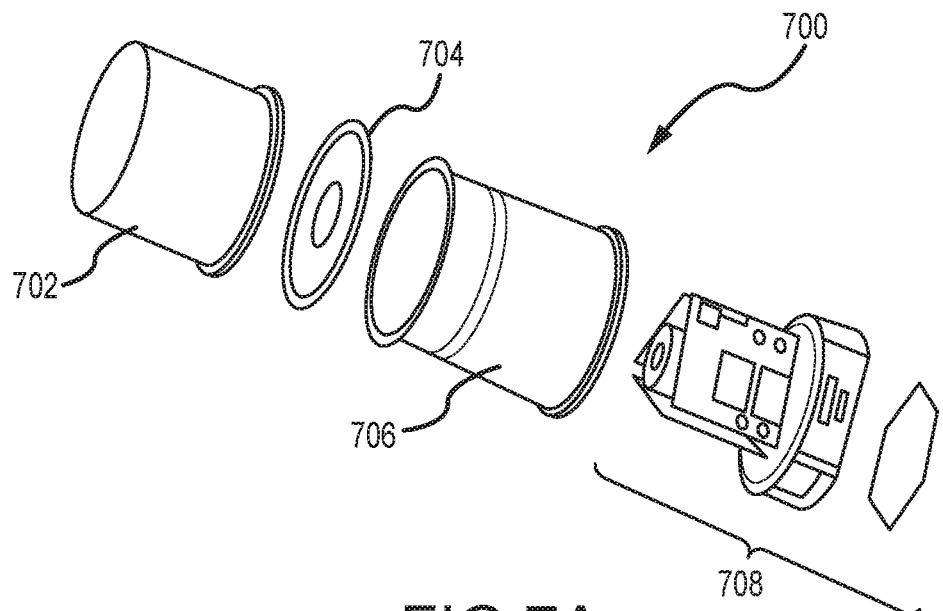
FIG. 7a is an exploded perspective view of an imaging device with an interconnector according to embodiments of the present disclosure.
Figure 7B:
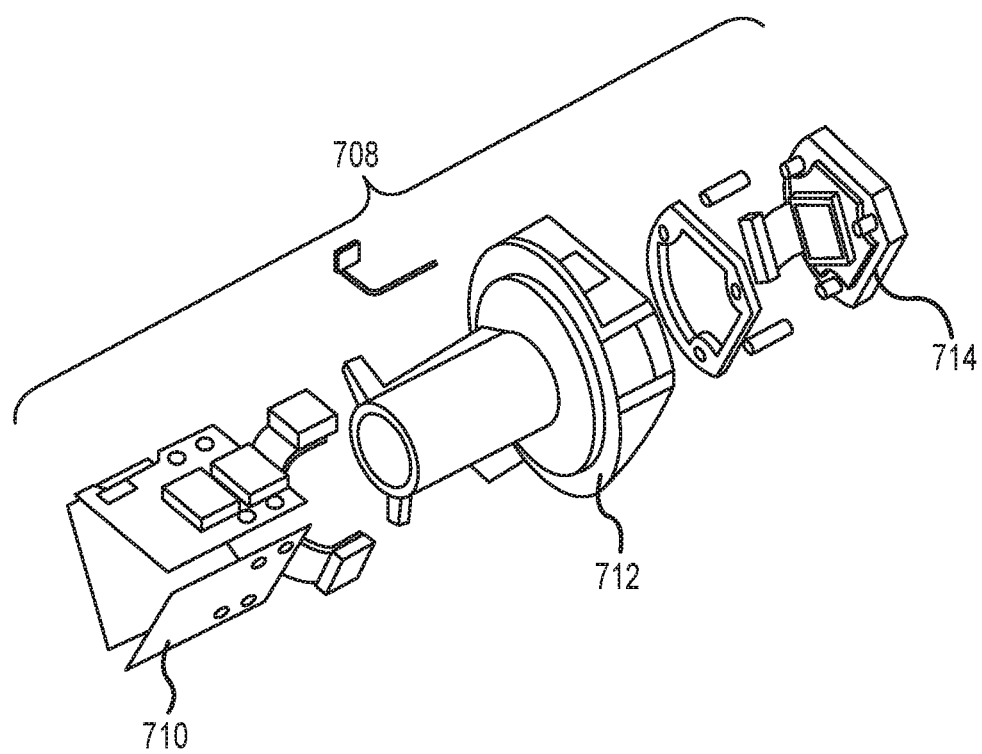
FIG. 7b is an exploded perspective view of an imaging device with an interconnector according to embodiments of the present disclosure.

FIGS. 7A-7B are exploded perspective views of a detector assembly 700 comprising a focal plane assembly according to embodiments of the present disclosure. The detector may comprise a star tracker assembly. As shown in FIG. 7A, the detector assembly 700 comprises a light shade 702, a baffle 704, and a radiation shield 706. A detector core 708 is provided that comprises an optical subassembly, processor electronics, and a focal plane assembly 714. FIG. 7B is an exploded perspective view showing the focal plane assembly 714 and interconnected components. Specifically, and as shown in FIG. 7B, the processor electronics 710, an optical subassembly 712, and the focal plane assembly 714 are interconnectable. The detector core 708 in this example comprises a stellar focal plane array that comprises at least one of a CMOS device and a CCD device. In various embodiments, the detector assembly 700 comprises a thermoelectric cooler for managing heat in the assembly. The thermoelectric cooler is contemplated as comprising various devices using the Peltier effect such as a solid state active heat pump, for example.

Figure 8:
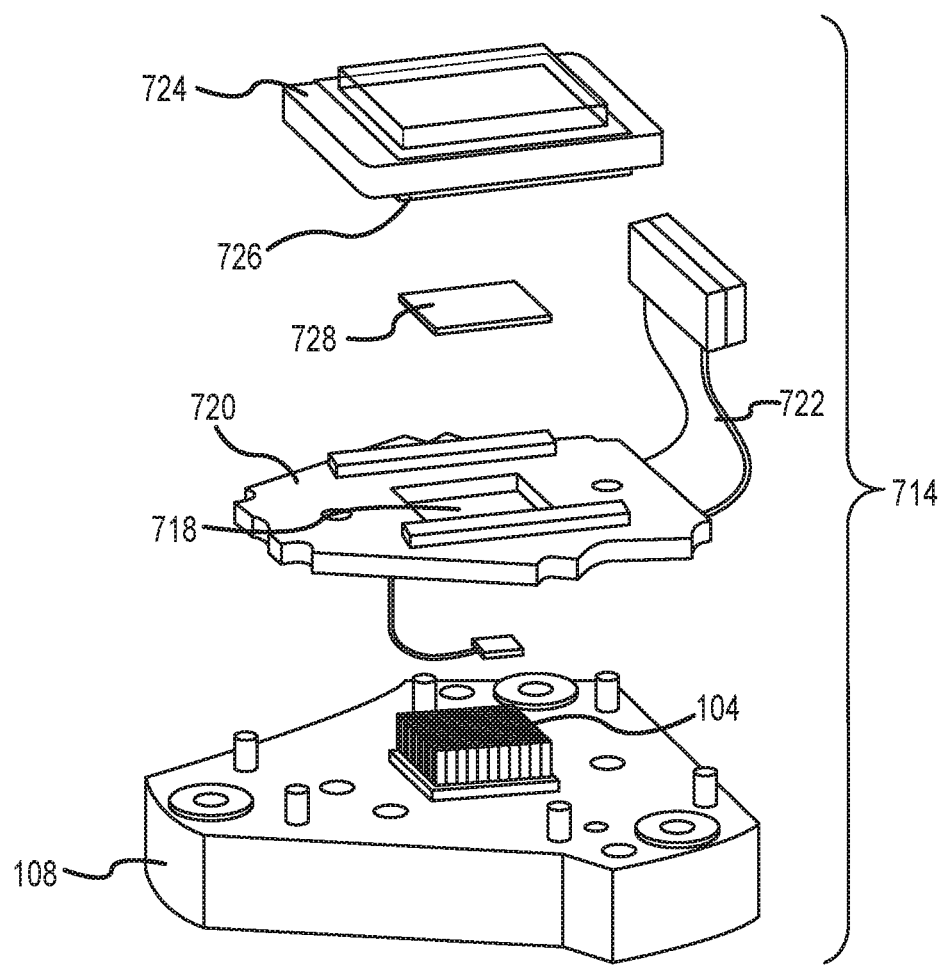
FIG. 8 is an exploded perspective view of a focal plane assembly comprising an interconnector in accordance with embodiments of the present disclosure.

FIG. 8 is an exploded perspective view of the focal plane assembly 714 shown in FIGS. 7A-7B. As shown in FIG. 8, the focal plane assembly 714 comprises a base 108 with an interconnector 104 provided thereon and wherein the interconnector 104 comprises a plurality of pins as shown and described with respect to various embodiments herein. A circuit or control board 718 is provided and comprises an aperture 720 that is operable to receive the interconnector 104. The control board 718 comprises passive electronics that provide drive circuitry, and further comprises a hardwire connection 722 to connect to and communicate with various additional components of the assembly 710. A CMOS component 724 is provided that preferably comprises digital command and control and which is capable of providing full frame video at 10 Hertz. The CMOS component 724 comprises a pin connection 726 that is operable to connect to and communicate with the interconnector 104 of the base 108. In some embodiments, the pin connection 726 and the interconnector 104 are at least partially connected by an adhesive layer 728.

In various embodiments, the base 108 comprises a platform to accommodate the components shown and described herein and provides a conductive thermal path for heat dissipation from features of the detector assembly 700 and the detector and processor assembly 708.

In various embodiments, methods of manufacturing a detector assembly are provided. In one embodiment, a method is provided that comprises forming an interconnector 104 comprising a base 108, providing a pin array 114 on the base 108 by forming a plurality of pins 116, 404 by making a plurality of cuts or voids in a first direction and a plurality of cuts or voids in a second direction. At least some of the plurality of pins 116 comprise a free end 124 on an opposing end of the pin 116 relative to the base 108. Each of the plurality of pins are spaced apart from an adjacent pin. A detector assembly 700 comprising a lens, a processor, and at least one of a Complementary Metal Oxide Semiconductor device and a Charged Coupled device is provided, and an adhesive or joining material 140 is provided in contact with a free end 124 of at least some of the pins 116, 404. At least a portion of the detector assembly 700 is secured to the pin array 114 via the adhesive 140.

In some embodiments, methods of the present disclosure further comprise a step of forming a capillary stop 608 in at least one of the plurality of pins 116, 404.

In some embodiments, methods of the present disclosure comprise forming cuts or voids wherein the first direction and the second direction are orthogonal to one another.

In some embodiments, methods of present disclosure are provided wherein the plurality of pins comprises a first set of pins 116, wherein the free end 124 of each of the pins in the first set of pins 116 is a first distance from a plane 110 of the base 108. A second set of pins 404 is provided, wherein the free end of each of the pins in the second set of pins 404 is a second distance from a plane 110 of the base 108. In various embodiments, at least some of the pins 116, 404 comprise a rectilinear cross section. In some embodiments, methods of the present disclosure are provided wherein the base and the pins are formed from a single piece of thermally conductive material.

Figure 9:
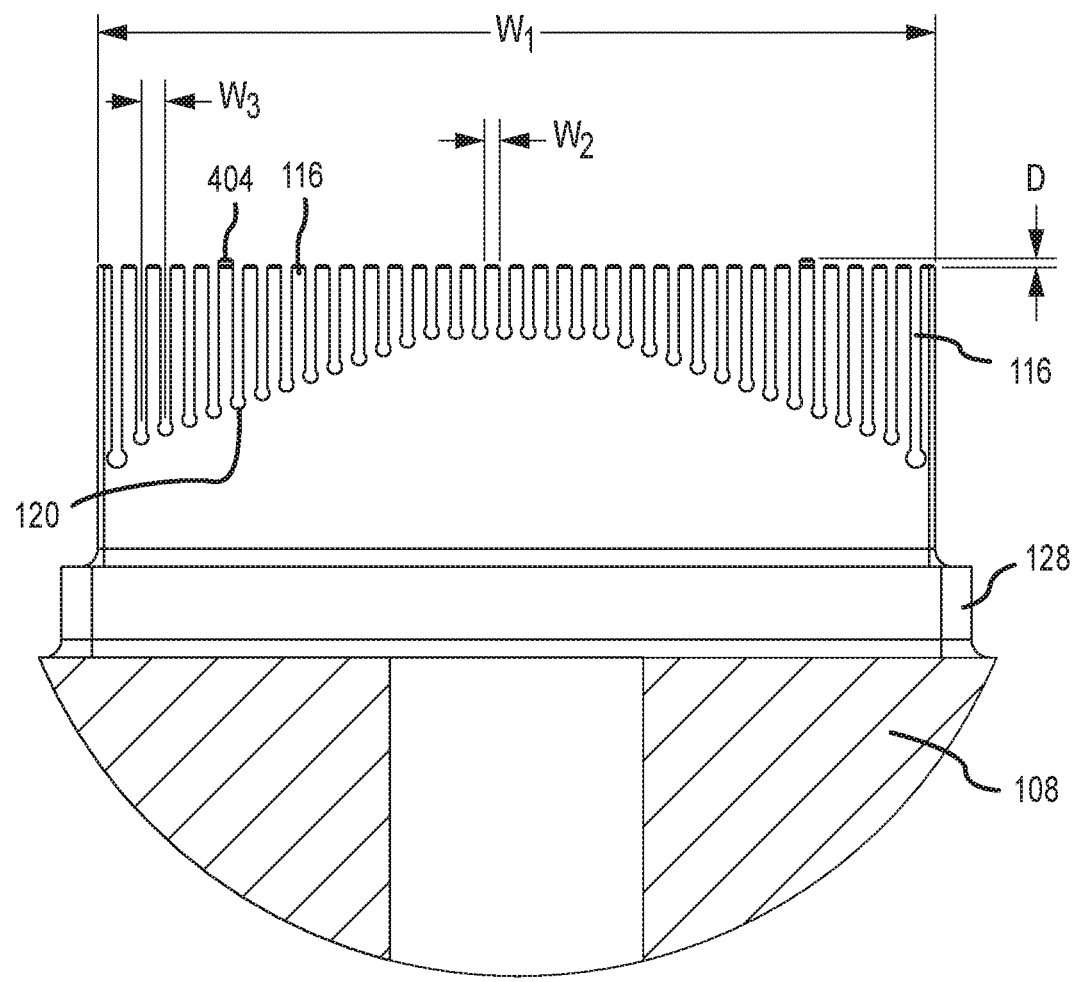
FIG. 9 is a cross-sectional elevation view of an interconnector according to one embodiment of the present disclosure.

FIG. 9 is a cross-sectional elevation view of an interconnector 114 according to one embodiment of the present disclosure. As shown, the interconnector 114 comprises a plurality of pins 116, 404 extending upwardly from a base pedestal portion 128 provided on a base 108. The interconnector 114 comprises pins of at least two different lengths, with a first set of pins 116 being shorter than at least one secondary pin 404. The differential D between the first set of pins 116 and the at least one secondary pin 404 comprises a distance of between approximately 0.0020 inches and 0.010 inches, and more preferably of about 0.003 and 0.007 inches.

The pins of the interconnector 114 comprise a total width $W_1$ that is between approximately 0.250 inches and 1.50 inches, and more preferably of between about 0.50 inches and 1.0 inches. In some embodiments, it is contemplated that the total width $W_1$ is between 0.60 inches and 0.80 inches, and preferably of about 0.694 inches. In various embodiments, the pins are provided in a square pattern.

The pins 116, 404 comprise a width $W_2$ that is between approximately 0.0050 inches and 0.050 inches, and more preferably of between about 0.010 inches and 0.020 inches. In some embodiments, it is contemplated that the pin width $W_2$ is between 0.010 inches and 0.0150 inches, and preferably of about 0.012 inches.

A distance between the center of gaps or slots between pins comprises a width $W_3$ that is between approximately 0.0050 inches and 0.050 inches, and more preferably of between about 0.010 inches and 0.030 inches. In some embodiments, it is contemplated that the width $W_3$ is approximately 0.020 inches.

As shown in the cross-section of FIG. 9, the pins 116 are distributed across a base pedestal 128 that describes a substantially frustoconical surface or form. A first set of pins 116 is therefore comprised of a plurality of pins that have different heights between their base and their free end. However, each of the free ends of the first set of pins 116 terminates at approximately the same distance from the base 108. The secondary pins 404 are shown as having the same length with their base 120 and free ends provided in the same plane, respectively. In alternative embodiments, however, it is contemplated that the secondary pins comprise a different total length with free ends that terminate in the same plane, similar to the first set of pins 116 shown in FIG. 9.

Figure 10B:
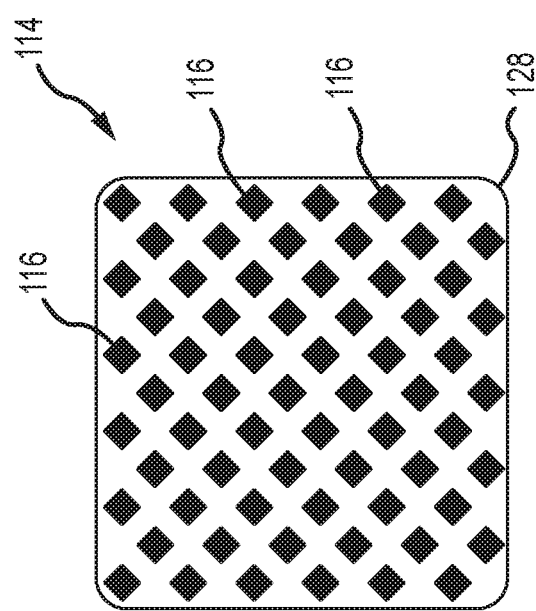
FIG. 10B is a detailed top plan view of the interconnector according to one embodiment of FIG. 10A.
Figure 10A:
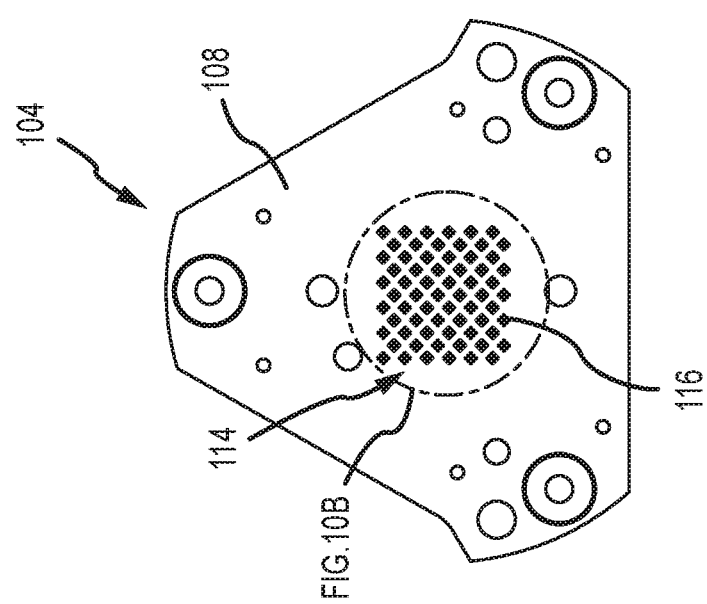
FIG. 10A is a top plan view of an interconnector according to one embodiment of the present disclosure.

FIG. 10A is a top plan view of an interconnector 104 comprising a base and a pin array 114. As shown, the pin array 114 comprises a plurality of pins 116 that are oriented differently from the embodiment shown in FIG. 2, for example. The cuts or void spaces between pins 116 comprise diagonal cuts that form a plurality of rows and a plurality of columns. FIG. 10B is a detailed plan view of the pin array 114 of FIG. 10A. As shown, the pins 116 comprise a rectilinear cross-section formed in part by a plurality of orthogonal cuts. The pins 116 preferably extend upwardly from a base pedestal portion 128 provided on the base 108. The pins 116 of FIGS. 10A-10B may comprise pins that all extend to the same height above the base 108. Alternatively, and as shown and described herein, the pins 116 of FIGS. 10A-10B may comprise at least three pins of a different height above the base 108 from a remainder of the pins 116.

Although various examples of an interconnection have been described in connection with securing a first component comprising an imaging, sensing, or tracking detector such as a CMOS or CCD detector for a star tracker application or other electronic package or device to a second assembly or component, embodiments of the present disclosure are not so limited. For example, an interconnector as described herein can be used to secure any first component having a first coefficient of thermal expansion to any second component having a second coefficient of thermal expansion securely, and while maintaining a high degree of stability in positional accuracy between the components. In accordance with the least some embodiments of the present disclosure, the interconnector can comprise a monolithic structure formed from a single or integral piece of material. In accordance with further embodiments of the present disclosure, the interconnector can be formed from a thermally conductive material. Examples of suitable materials include aluminum.

In accordance with at least some embodiments of the present disclosure, the technology encompasses:

(1) An interconnector comprising:
a base;
a pin array including a plurality of pins, and wherein the pins extend from the base;

at least some of the plurality of pins comprising a free end provided a first distance from the base;

wherein each of the plurality of pins are spaced apart.

(2) The interconnector of (1), wherein at least three of the plurality of pins each have a free end that is a second distance from the base, and wherein the second distance is greater than the first distance.

(3) The interconnector of (2), wherein a length of each of the at least three pins, measured from a base of each of the at least three pins to the free end of the at least three pins, is the same.

(4) The interconnector of any of (2) to (3), wherein a length of each of the remainder of the pins, measured from a base of each of the remainder of the pins to the free end of the remainder of the pins, is the same.

(5) The interconnector of any of (1) to (4), wherein a length of any of the pins is measured from a base of a respective pin to a free end of the respective pin, wherein a length of at least a first pin located proximal to a center of the pin array is less than a length of at least a second pin that, relative to the first pin, is located proximal to an edge of the pin array.

(6) The interconnector of any of (1) to (4), further comprising:

a base pedestal, wherein the base pedestal is formed on the base, wherein the pins extend from the base pedestal, and wherein a surface of the base pedestal is non-planar.

(7) The interconnector of (6), wherein the surface of the base pedestal is curved.

(8) The interconnector of any of (1) to (7), wherein the base and the pins are formed from a single piece of thermally conductive material.

In accordance with further aspects of the present disclosure, the technology encompasses:

(9) A method of manufacturing a detector assembly, the method comprising:

forming an interconnector comprising a base, providing a pin array on the base, wherein providing the pin array comprises forming a plurality of pins by making a plurality of cuts in a first direction and a plurality of cuts in a second direction;

wherein at least some of the plurality of pins comprise a free end on an opposing end of the pin relative to the base;

wherein each of the plurality of pins are spaced apart from an adjacent pin;

providing a detector assembly comprising a lens, a processor, and at least one of a Complementary Metal Oxide Semiconductor device and a Charged Coupled device;

providing an adhesive or joining material, wherein the adhesive is in contact with a free end of at least some of the pins; and securing at least a portion of the detector assembly to the pin array via the adhesive.

(10) The method of (9), further comprising a step of forming a capillary stop in at least one of the plurality of pins.

(11) The method of any of (9) to (10), wherein the first direction and the second direction are orthogonal to one another.

(12) The method of any of (9) to (11), wherein the plurality of pins comprises a first set of pins, wherein the free end of each of the pins in the first set of pins is a first distance from a plane of the base; and a second set of pins, wherein the free end of each of the pins in the second set of pins is a second distance from a plane of the base.

(13) The method of any of (9) to (12), wherein at least some of the pins comprise a rectilinear cross section.

(14) The method of any of (9) to (13), wherein the base and the pins are formed from a single piece of thermally conductive material.

In accordance with further aspects of the present disclosure, the technology encompasses:

(15) An interconnector assembly, comprising:

an interconnector comprising a base and a pin array;

the pin array comprising a plurality of pins extending from the base;

a first assembly connected to the interconnector and in contact with at least some of the plurality of pins;

an adhesive provided in contact with the first assembly and a free end of at least some of the plurality of pins.

(16) The interconnector assembly of (15), wherein the first assembly comprises a detector assembly.

(17) The interconnector assembly of any of (15) to (16), wherein the first assembly comprises a Complementary Metal Oxide Semiconductor device.

(18) The interconnector assembly of any of (15) to (16), wherein the first assembly comprises a Charged Coupled device.

(19) The interconnector assembly of any of (15) to (18), wherein the base and the pin array are formed from a single piece of thermally conductive material.

(20) The interconnector assembly of any of (15) to (19), wherein the first assembly comprises a thermoelectric cooler for managing heat in the assembly.

The foregoing discussion of the invention has been presented for purposes of illustration and description. Further, the description is not intended to limit the invention to the form disclosed herein. Consequently, variations and modifications commensurate with the above teachings, within the skill or knowledge of the relevant art, are within the scope of the present invention. The embodiments described hereinabove are further intended to explain the best mode presently known of practicing the invention and to enable others skilled in the art to utilize the invention in such or in other embodiments and with various modifications required by the particular application or use of the invention. It is intended that the appended claims be construed to include alternative embodiments to the extent permitted by the prior art.

What is claimed is:

1. An interconnector comprising:
    a base;
    a pin array including a plurality of pins; and
    a base pedestal, wherein the base pedestal is formed on the base, wherein the pins extend from the base pedestal, wherein a surface of the base pedestal is non-planar, wherein at least some of the pins in the plurality of pins include a free end at a first distance from a surface of the base that defines a base reference plane, wherein each of the plurality of pins are spaced apart from one another, and wherein a pin near a center of the pin array has length to width ratio that is less than a length to width ratio of a pin proximal to an edge of the pin array.

2. The interconnector of claim 1, wherein at least three of the plurality of pins each have a free end that is a second distance from the surface of the base that defines the base reference plane, and wherein the second distance is greater than the first distance.

3. The interconnector of claim 2, wherein a length of each of the at least three pins, measured from surface of the base that defines the base reference plane to the free end of the at least three pins, is the same.

4. The interconnector of claim 3, wherein a length of each of the remainder of the pins, measured from the surface of the base that defines the base reference plane to the free end of the remainder of the pins, is the same.

5. The interconnector of claim 1, wherein a length of any of the pins is measured from the surface of the base that defines the base reference plane to a free end of the respective pin, wherein a length of at least a first pin located proximal to a center of the pin array is less than a length of at least a second pin that, relative to the first pin, is located proximal to an edge of the pin array.

6. The interconnector of claim 1, wherein the surface of the base pedestal is curved.

7. The interconnector of claim 1, wherein the base and the pins are formed from a single piece of thermally conductive material.

8. The interconnector of claim 1, wherein side surfaces of at least some of the pins are parallel to one another.

9. A method of manufacturing a detector assembly, the method comprising:
forming an interconnector comprising a base, providing a pin array on the base, wherein providing the pin array comprises forming a plurality of pins by making a plurality of cuts in a first direction and a plurality of cuts in a second direction;
wherein at least some of the plurality of pins comprise a free end on an opposing end of the pin relative to the base;
wherein each of the plurality of pins are spaced apart from an adjacent pin;
providing a detector assembly comprising an optical sub-assembly and at least one of a Complementary Metal Oxide Semiconductor device and a Charged Coupled device;
providing an adhesive or joining material, wherein the adhesive is in contact with a free end of at least some of the pins; and
securing at least a portion of the detector assembly to the pin array via the adhesive.

10. The method of claim 9, further comprising a step of forming a capillary stop in at least one of the plurality of pins.

11. The method of claim 9, wherein the first direction and the second direction are orthogonal to one another.

12. The method of claim 9, wherein the plurality of pins comprises a first set of pins, wherein the free end of each of the pins in the first set of pins is a first distance from a plane of the base; and
a second set of pins, wherein the free end of each of the pins in the second set of pins is a second distance from a plane of the base.

13. The method of claim 9, wherein at least some of the pins comprise a rectilinear cross section.

14. The method of claim 9, wherein the base and the pins are formed from a single piece of thermally conductive material.

* * * * *